United States Patent [19]
Chiou

[11] Patent Number: 5,423,375
[45] Date of Patent: Jun. 13, 1995

[54] CPU HEAT SINK MOUNTING STRUCTURE

[76] Inventor: Ming D. Chiou, 3F., No. 4, Lane 327, Alley 11, Chung Shan Rd., Chung Ho City, Taipei, Taiwan, Prov. of China

[21] Appl. No.: 318,921

[22] Filed: Oct. 6, 1994

[51] Int. Cl.6 .................... F28F 7/00; H05K 7/20
[52] U.S. Cl. .................... 165/80.3; 165/185; 174/16.3; 257/719; 361/697; 361/704
[58] Field of Search .................... 165/80.3, 185, 125, 165/121, 122; 174/16.3; 257/713, 718, 719, 722; 361/702-704, 709, 692, 695, 697

[56] References Cited
U.S. PATENT DOCUMENTS

| | | | |
|---|---|---|---|
| 5,304,735 | 4/1994 | Earl et al. | 174/16.3 |
| 5,309,983 | 5/1994 | Bailey | 165/80.3 |
| 5,353,863 | 10/1994 | Yu | 165/80.3 |
| 5,357,404 | 10/1994 | Bright et al. | 361/704 X |
| 5,373,099 | 12/1994 | Boitard et al. | 174/16.3 |

Primary Examiner—Martin P. Schwadron
Assistant Examiner—L. R. Leo
Attorney, Agent, or Firm—Pro-Techtor International

[57] ABSTRACT

A CPU heat sink mounting structure including a CPU, a heat sink attached to one side of the CPU to hold an electric fan for dissipating heat from the CPU, and a plurality of clamps fastened to the heat sink to hold down the CPU, each clamp having a forked mounting portion fastened to a respective retaining hole on the heat sink and a clamping portion clamped on the CPU to hold down the CPU on the heat sink.

2 Claims, 3 Drawing Sheets

CPU HEAT SINK MOUNTING STRUCTURE

BACKGROUND OF THE INVENTION

The present invention relates to a CPU heat sink mounting structure for detachably fastening a heat sink to a CPU by clamps permitting heat to be quickly carried away from the CPU by the radiating fins of the heat sink and the fan, which is installed in the heat sink within the radiating fins.

The CPU of an electronic apparatus will release heat during its operation. If heat cannot be quickly carried away, the operation of the CPU and the nearby electronic components will be affected, causing operation errors. Electric fans are now commonly used for this purpose. However, the installation of an electric fan still cannot quickly effectively carry heat away from the CPU.

SUMMARY OF THE INVENTION

According to one aspect of the present invention, the CPU heat sink mounting structure comprises a CPU, a heat sink attached to one side of the CPU to hold an electric fan for dissipating heat from the CPU, and a plurality of clamps fastened to the heat sink to hold down the CPU.

According to another aspect of the present invention, each clamp comprises a clamping portion terminating in a hooked tip clamped on the CPU, and a forked mounting portion extended from the clamping portion and fastened to a respective retaining hole on the heat sink by hook joint, the forked mounting portion having a hooked tip hooked on the heat sink.

DETAILED DESCRIPTION OF THE PREFERRED EMBODIMENT

Figure 1:
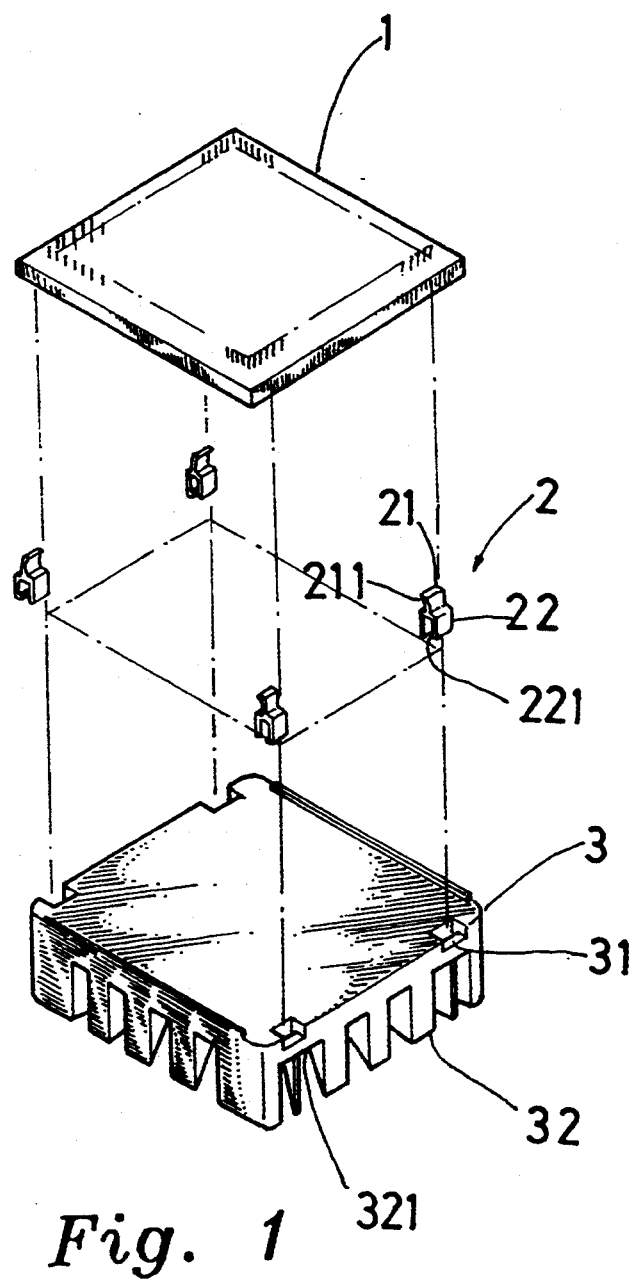
FIG. 1 is an exploded view of a CPU heat sink mounting structure according to the present invention.
Figure 2:
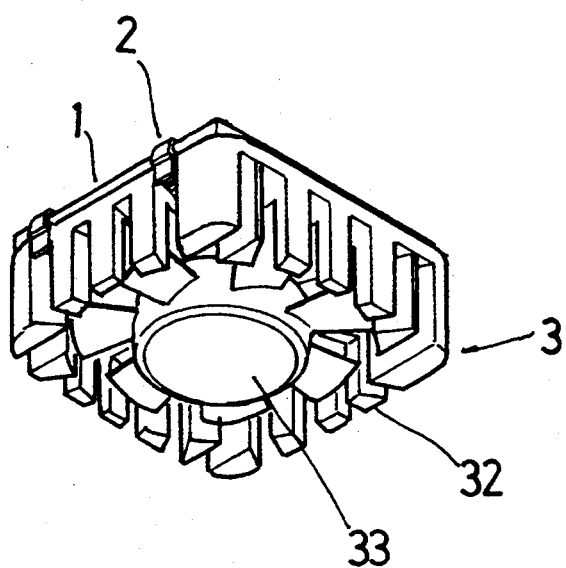
FIG. 2 is a perspective view showing the CPU heat sink mounting structure of FIG. 1 assembled.

Referring to FIG. 1, a CPU heat sink mounting structure in accordance with the present invention is generally comprised of a CPU 1, a plurality of clamps 2, and a heat sink 3. The heat sink 3 comprises a flat bottom wall 321 fitting over the CPU 1, a plurality of radiating fins 32 raised from the flat bottom wall 321 around the border, and a plurality of retaining holes 31 through the bottom wall 321 near the border and respectively disposed at the center between two radiating fins 32. The clamps 2 are respectively fastened to the retaining holes 31 on the heat sink 3 to firmly retain the CPU 1 to the bottom wall 321 of the heat sink 3 (see FIG. 2).

Figure 4:
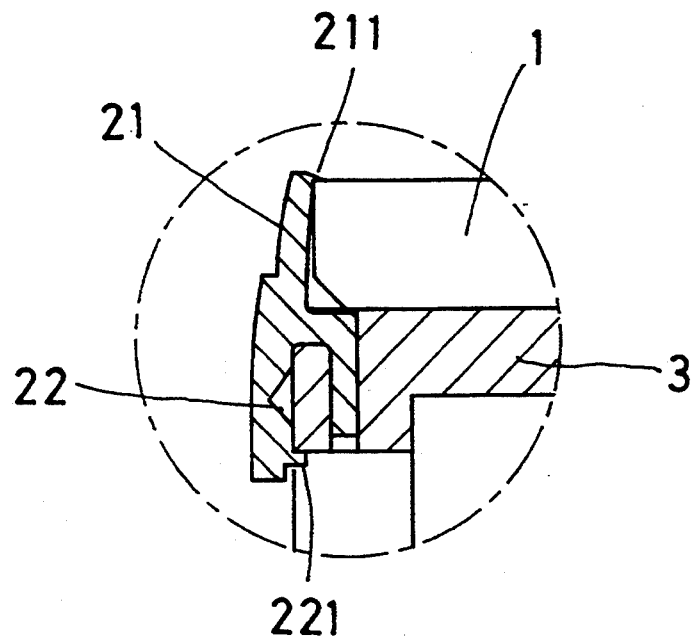
FIG. 4 is partial view in an enlarged scale taken on part of FIG. 3.
Figure 3:
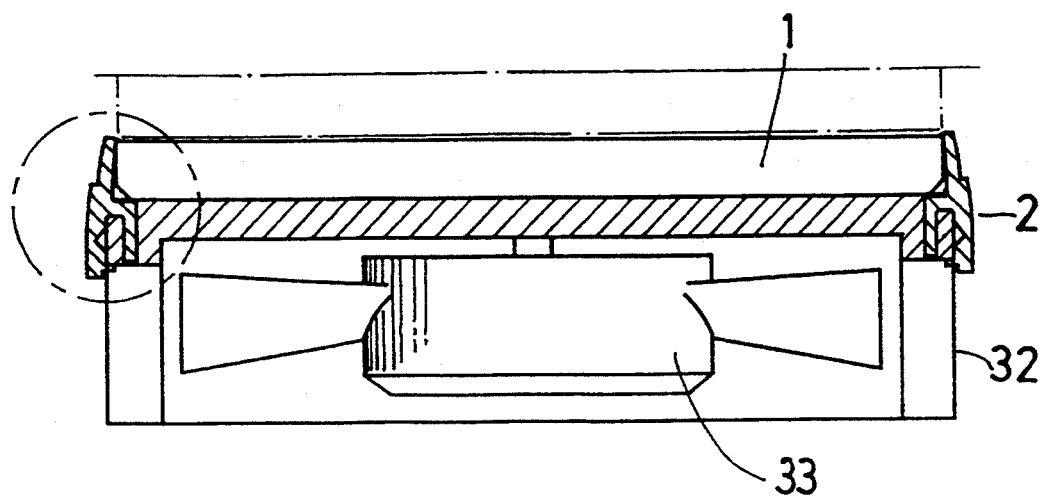
FIG. 3 is a longitudinal view in section of the CPU heat sink mounting structure of FIG. 2.

Referring to FIGS. 3 and 4, the clamp 2 comprises a clamping portion 21 and a forked mounting portion 22 extended from the clamping portion 21. The clamping portion 21 has a hooked tip 211 clamped on the CPU 1, forked mounting portion 22 is fastened to one retaining hole 31 on the heat sink 3, having a hooked tip 221 hooked on the bottom wall 321 of the heat sink.

Referring to FIGS. 2 and 3 again, an electric fan 33 is mounted on the heat sink 3 within the radiating fins 32. When the CPU 1 is operated, the electric fan 33 is simultaneously turn on to cause currents of air for carrying heat, which is transmitted from the CPU 1 to the heat sink 3, away from the radiating fins 32. Because the CPU 1 is fastened to the heat sink 3 by the clamps 2, the CPU 1 and the heat sink 3 can be conveniently separated from each other by unfastening the clamps 2.

While only one embodiment of the present invention has been shown and described, it will be understood that various modifications and changes could be made without departing from the spirit and scope of the invention. For example, stop ribs may be made on the bottom wall 321 of the heat sink 3 along two opposite sides to stop two opposite sides of the CPU 1, and the retaining holes 31 are spaced along the border of the heat sink 3 between the stop ribs for mounting the clamps 2.

What is claimed is:

1. A CPU heat sink mounting structure comprising a CPU, a heat sink attached to one side of said CPU for dissipating heat from said CPU, and a plurality of clamps fastened to said heat sink to hold down said CPU, wherein each clamp comprises a clamping portion terminating in a hooked tip clamped on said CPU, and a forked mounting portion extended from said clamping portion and fastened to a respective retaining hole on said heat sink by a hook joint, said forked mounting portion having a hooked tip hooked on said heat sink.

2. The CPU heat sink mounting structure of claim 1 wherein said heat sink comprises a flat bottom wall attached to said CPU, two stop ribs raised from said bottom wall along two opposite sides, a plurality of retaining holes spaced along the border of said bottom wall between said stop ribs, which receive said clamps, a plurality of radiating fins spaced along the border of said bottom wall opposite to said CPU, and an electric fan disposed within said radiating fins.

* * * * *